United States Patent [19]

Petrovick, Jr. et al.

[11] Patent Number: 4,975,599

[45] Date of Patent: Dec. 4, 1990

[54] METHOD AND RESULTING DEVICES FOR COMPENSATING FOR PROCESS VARIABLES IN A CMOS DEVICE DRIVER CIRCUIT

[75] Inventors: John G. Petrovick, Jr., Colchester; Robert S. Taylor, Essex Junction, both of

[73] Assignee: International Business Machines Corporation, Armonk, N.Y.

[21] Appl. No.: 385,629

[22] Filed: Jul. 26, 1989

[51] Int. Cl.$^5$ .......................................... H03K 17/14
[52] U.S. Cl. ................................ 307/443; 307/451; 307/481; 307/263; 307/594; 307/296.8; 307/310
[58] Field of Search ............... 307/443, 448, 451, 473, 307/475, 481, 263, 591, 594, 296.8, 308, 310

[56] References Cited

U.S. PATENT DOCUMENTS

| | | | |
|---|---|---|---|
| 4,242,604 | 12/1980 | Smith | 307/443 |
| 4,473,762 | 9/1984 | Iwahashi et al. | 307/594 |
| 4,614,882 | 9/1986 | Parker et al. | 307/263 X |
| 4,742,247 | 3/1988 | Venkatesh | 307/310 X |
| 4,760,288 | 7/1988 | Peczalski | 307/310 X |
| 4,763,021 | 8/1988 | Stickel | 307/475 |
| 4,791,326 | 12/1988 | Vajdie et al. | 307/451 X |
| 4,818,901 | 4/1989 | Young et al. | 307/443 X |
| 4,820,942 | 4/1989 | Chan | 307/443 X |
| 4,857,770 | 8/1989 | Pantovi et al. | 307/296.8 X |
| 4,894,561 | 1/1990 | Nogami | 307/310 X |

OTHER PUBLICATIONS

Redkokasha, "Reduction of the Temperature Dependence of the Channel Resistance in a MOS Transistor", Meas. Tech (U.S.A.), vol. 22, No.7, Dec. 1979, pp. 838-840.

Primary Examiner—David Hudspeth
Attorney, Agent, or Firm—Calfee, Halter & Griswold

[57] ABSTRACT

According to the present invention, an improved CMOS integrated circuit and an improved method of forming the circuit is provided. The circuit has a first FET device and a second FET device, and at least one performance characteristic of said first and second FET devices varies in the same manner with the variation of at least one performance related process variable condition. Each of said FET devices has an output signal at least one characteristic of which is changed by a change in the performance related variable condition. The first and second FET devices are connected such that the one output characteristic of the second FET device acts in opposition to the one output characteristic of the first FET device to provide a merged output signal representative of the combined effect of the two FET devices. The second FET device is constructed so as to be more responsive to the variations in said performance related variable condition than the first FET device and to have a weaker output signal than the first FET device, whereby the merged output signal of the two FET devices is maintained relatively constant irrespective of variations in the performance related variable condition.

18 Claims, 1 Drawing Sheet

METHOD AND RESULTING DEVICES FOR COMPENSATING FOR PROCESS VARIABLES IN A CMOS DEVICE DRIVER CIRCUIT

BACKGROUND OF THE INVENTION

This invention relates generally to a technique and resulting structure which compensates for performance differences of devices due to process variations in the process of manufacturing integrated circuit devices and in particular, circuits utilizing CMOS technolgy. In more particular aspects, this invention relates to a technique and resulting structure which compensates for process variables, and variables in supply voltage, and operating temperature in the manufacture and operation of device drivers for integrated circuits on chips utilizing CMOS technology.

In the production of integrated circuit devices, and particularly in the production of circuits using CMOS technology, process variables or variations can significantly affect the performance of many of the devices particularly device drivers which are formed on the chip. These performance variables include delay, rise and fall time, impedance, etc., and indeed in uncompensated CMOS circuits the 3-sigma statistical combination of these independent variations on driver devices can be as much as ±60%. These process variables which affect the performance include variation of channel length (which typically can vary up to ±35%); threshold voltage (±20%) the thickness of the dielectric in the gate electrode channel (±20%); diffusion channel width (±2%); and supply voltage (±10%). As indicated above, all of these various independent factors can have a significant effect even to the accumulative effect of as much as ±60% difference in device characteristic between worst case performance i.e. slowest, and best case performance i.e. fastest. (As used herein "best case" and "worst case" are not qualitative values, but rather are quantitative in that "best case" denotes fastest response time and "worst case" denotes slowest response time). These variations have a significant effect on the performance of the devices in various circuits. In the driver circuit when the driver circuit is designed to drive a certain load, if the driver circuit operates too fast and too many drivers are switched on at once, noise will be generated which will be very high due to inductance which will interfere with or even prevent the proper signal recognition. Therefore, a circuit cannot be designed which operates too fast under any given load or the design will be selfdefeating. On the other hand, if the device driver circuit is designed to operate at an extremely slow speed, performance time is lost. Thus, if simultaneous operation of a known number of drivers is required, the inherent variation in performance of the drivers due to process variations prevent the designer from designing close to the optimum rate of performance. Expressed another way, if there is a wide variation in performance characteristics of a driver circuit and a circuit designer designs a circuit to drive at a "nominal" rate which is slow enough to prevent excessive noise being produced but rapid enough to produce good desirable speed, then under certain process conditions the resulting circuit may in fact operate so fast that it encounters noise or inductance problems and is unsatisfactory because of process variations. Therefore, without circuit compensation, the circuit designer is forced to design to a speed which, even under "best" conditions of process varibles which result in the fastest speed of the device driver, will result in a speed which is not so fast that it will induce excessive noise. Of course this designed speed, when there is a significant amount of variation in the process parameters, will be a very low speed, and in fact, in worse case conditions i.e. the slowest operation of the driver's circuit due to process variations, will have an extremely slow driver circuit this speed being significantly slower than that at which it could optimately perform without producing excessive noise. Of course, it would be desirable to reduce to a minimum level the amount of variations introduced by the processing techniques utilized in the manufacture of integrated circuits. However, with the present state of the art of such processing, there are not available any viable commercially acceptable cost effective means to substantially reduce these variables; hence, it becomes necessary to compensate for these process variables. There have in fact been several techniques suggested for compensating for such process variables. One such technique is the so called "serpentine gates", which helps to compensate for delay in which output device gates are connected by connecting the gates in series instead of parallel and thus the turn-on time for each successive finger is delayed by a time proportionate to the resistance of the gate and its capacitance. Since gate resistance increases as channel length decreases, this technique reduces the delay variation with channel length variation which is the most sensitive process parameter. While this technique does reduce certain process related variations somewhat, it does nothing to compensation for variations in supply voltage or other process parameters. This also has other potential difficulties in that with certain types of silicides, an extra mask may be required to generate a precision resistor when this technique is used.

Another technique for reducing the effect of processing variables is shown and described in U.S. patent application Ser. No. 240,853, filed Sept. 2, 1988, Entitled "Performance Enhancing for Integrated Circuit Chips". This technique consists of counting the number of stages in an on-chip delay path that switch within one cycle of an off-chip oscillator and using the count as a basis for digitally adjusting the performance of all drivers on the chip. The complexity of this technique makes it unattractive. Also, in this technique, the same compensation is applied to all drivers on the chip, regardless of localized process differences on the chip. For example, N/FET'S and P/FET'S are given identical compensation even if there are differences in their respective characteristics.

Another technique utilizes feedback from the output node which is shown and described in U.S. patent application No. 07/419,341 filed: Oct. 10, 1989 entitled: CMOS Driver Circuit. However, this is a technique which compensates for off-chip load and not for process variations.

Other various prior art patents suggest various circuits and compensations which include U.S. Pat. No. 4,613,772 which compensates for leakage currents in internal logic gates but does not compensate for process variations; U.S. Pat. No. 4,584,492 compensates trigger points on input buffers but doesn't use opposition currents in prebuffers to control gate voltage on buffer devices; U.S. Pat. No. 4,634,893 discloses a PROM programmed drive, but there is no compensation for the process variations; U.S. Pat. No. 4,570,091 is a dynamic logic precharge with cascode voltage switch and logic for improved performance, but it does not disclose any compensation for process variations; IBM Technical Disclosure Bulletin 31, No. 1, June 1988, pages 21-23 shows a series of devices for certain compensation but does not show opposition devices to control gate voltage; IBM Technical Disclosure Bulletin 27, No. 10B, Mar. 1985, pages 6,012 to 6,013 shows CVS logic which improves logic performances but does not show any means for compensating for various process variable.

SUMMARY OF THE INVENTION

According to the present invention, an improved intetrated circuit which is preferably a CMOS circuit and an improved method of forming the circuit is provided which circuit has at least a first FET device and a second FET device and wherein at least one performance characteristic of said first and second FET devices varies in the same manner with the variation of at least one performance related process variable condition. Each of said FET devices has an output signal at least one characteristic of which is changed by a change in the performance related variable condition. The first and second FET devices are connected such that said one output characteristic of said second FET device acts in opposition to said one output characteristic of the first FET device to provide a merged output signal representative of the combined effect of said FET devices. The second FET device is constructed so as to be more responsive to the variations in said performance related variable condition than the first FET device and to have a weaker output signal than the first FET device, whereby the merged output signal of said FET devices is maintained relatively constant irrespective of variations in the performance related variable condition.

DESCRIPTION OF THE PREFERRED EMBODIMENT

Figure 1:
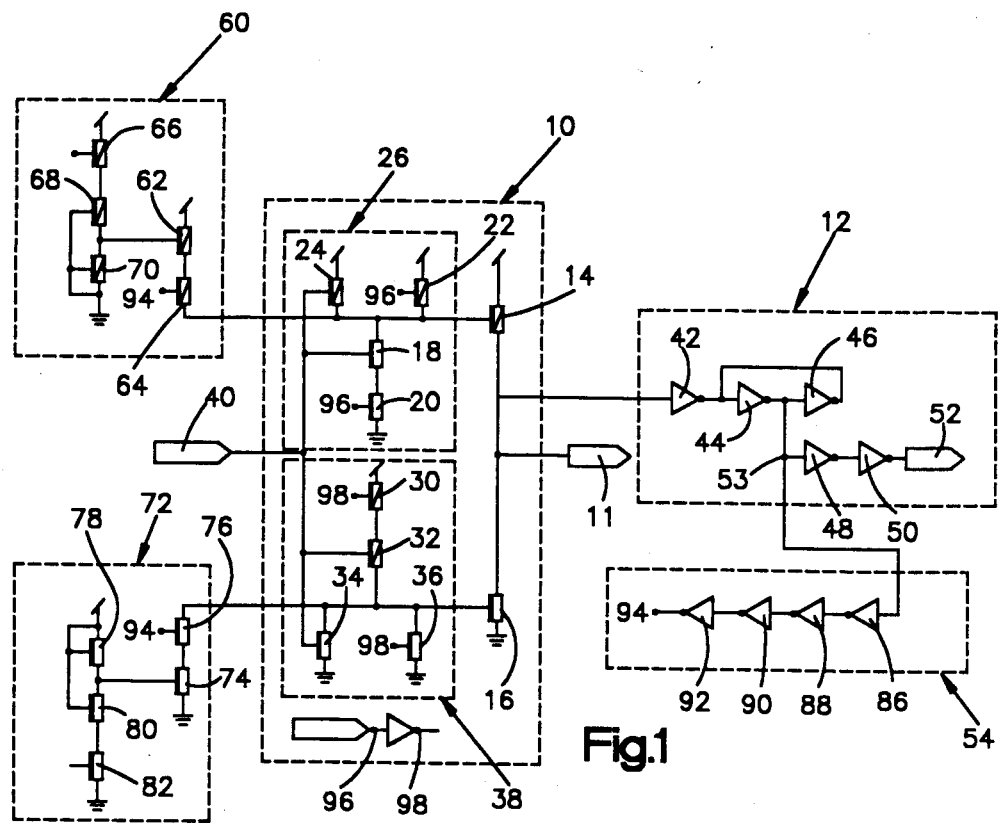
FIG. 1 is a circuit diagram of an embodiment of a CMOS circuit according to this invention.

Referring now to the drawing and for the present to FIG. 1, a CMOS circuit according to the present invention is shown. The circuit includes a conventional driver circuit 10 which drives a group of off-chip load devices such as capacitors indicated collectively as 11. The driver circuit 10 is also connected to a receiver circuit 12. The driver circuit includes a P/FET transistor 14 and an N/FET transistor 16 coupled to drive the load 11. These transistors 14 and 16 are pull-up and pull-down transistors, respectively, connected in a conventional way to drive the load 11. The transistor 14 is turned on by transistors 18 and 20 connected in series. Transistors 22 and 24 are also connected to transistor 14 for the purpose of turning off said P/FET transistor 14. The transistors 18, 20, 22 and 24 constitute a conventional NAND gate shown in broken outline and designated as 26.

Similarly, transistor 16 is turned on by P/FET transistors 30 and 32 connected in series. Transistor 16 is also connected to N/FET transistors 34 and 36 for the purpose of turning off said N/FET transistor 16. The transistors 30, 32, 34 and 36 constitute a conventional NOR gate shown in broken outline and designated by the reference character 38. The signal to operate the transistors 18 and 24 and transistors 32 and 34 is provided from an input source 40. In a well-known manner, when a signal is provided to transistors 18 and 32 to turn them on, one or the other will be actuated which in turn will turn on the respective associated transistor 14 or 16 which will supply voltage to the load 11 and the receiver 12, which is the receiver portion of a bidirectional input/output circuit and drives on-chip load 52 as well as delay line 54. The respective transistors 14 and 16 will also provide a signal to receiver 12, which is comprised of inverters 42, 44 and 46 connected in series, and also inverters 48 and 50 connected in series and tapped between inverters 44 and 46. Inverter 50 supplies a signal to load 52. The receiver 12 acts as a buffer which will sense when the driver circuit 10 has switched "on" completely (as opposed to "on" partially) and provide an output signal at node 53.

The speed or rate at which either transistor 18 or 32 is turned on can vary widely, depending on many process variables. These process variables include the channel length of the transistors, the threshold voltage, the thickness of the dielectric between the gate electrode and the channel, the base mobility dictated by the background doping level, variations in channel width (this is a small effect but not completely negligible); and supply voltage. Other external variables can also affect the performance of the circuit such as temperature, etc. Therefore, if the driver circuit 10 were not compensated in some manner then, depending upon these process variables, the speed at which the transistors 14 or 16 would be turned "on" would vary widely depending upon how sensitive the transistors 18 and 20 and 30 and 32 are and thus how hard they turn "on" the transistors 14 and 16.

As discussed previously, if the transistors 14 and 16 are turned on too fast or too hard, the speed of operation of the output from the driver circuit is significantly increased and if it is too fast, excessive noise or responance results which makes it difficult to read the signal and thus the circuit cannot operate properly. However, if on the other hand, the transistors 18 and 20 and 30 and 32 turn on the transistors 14 and 16 too slowly due to process variables, the speed of the driver circuit 10 is significantly reduced thus causing a loss of performance.

In order to compensate for these variations in speed of the operation of the transistors 18 and 20 and 30 and 32 in turning "on" the transistors 14 and 16 and thus minimize the variation from worst case results (slowest actuation of the transistors) to best case (fastest actuation of transistors) compensators are provided. A compensator for the P channel is designated by the reference character 60 which includes P/FET transistors 62 and 64 connected in series and P/FET transistors 66, 68 and 70 connected in series as shown in FIG. 1, with the gate of transistor 62 being connected between transistors 68 and 70, this connection acting as a voltage divider. The output of transistors 62 and 64 is merged with the output of the N/FET transistors 18 and 20 as shown in FIG. 1 such that the outputs are in opposition to each other, i.e. the path from the transistors 18 and 20 to transistor 14 which is a pull-up transistor tends to turn the transistor 14 "on" when the transistors 18 and 20 are turned on, whereas the output of the transistors 62 and 64 tends to turn the transistor 14 "off" when they are turned "on" thus acting in opposition to the action of the transistors 18 and 20. Also, the transistors 62 and 64 are designed so that they are less powerful than the transistors 18 and 20 such that their action does not overcome the action of the transistors 18 and 20 but merely compensates for it by acting in opposition to the signal from the transistors 18 and 20.

Thus, it can be seen that if the process variables in the process of forming the transistors of the integrated circuit are such that any given process variable would tend to make the transistors 18 and 20 operate faster, the same process variables would also tend to make the transistors 62 and 64 operate faster. The faster operation of the transistor 18 and 20 would tend to turn the transistor 14 on harder, whereas the faster operation of the transistors 62 and 64 acting in opposition to this tend to hold back or slow down the operation of the transistor 14 in opposition to the action of the transistors 18 and 20. Conversely, if the process variables are such that they tend to make transistors 18 and 20 operate more slowly these same variables will tend to make transistors 62 and 64 also operate more slowly. The slower operation of the transistors 18 and 20 would tend to turn the transistors 14 on less hard, but the action of the transistors 62 and 64, which are in opposition thereto tend to speed them up. Hence, if the transistors 62 and 64 are less powerful but more sensitive to process variations, coaction of the transistors 18 and 20 with the transistors 62 and 64 act in an offsetting or compensating manner and provide a turn on signal to the transistor 14 which is much more relatively consistent irrespective of process variables than is attainable with an uncompensated driver circuit.

Similarly, the N channel compensator circuit 72 is provided which has FET transistors 74, 76, 78, 80 and 82 connected in manner similar to the transistors of the compensating circuit 62 and act in a similar manner in conjunction with transistors 30 and 32 to turn transistor 16 "on". The gates of transistors 34 and 24 are connected to input 40.

The output from the receiver 12 at node 53 is delivered to a delay circuit 54 which is comprised of a series of inverters 86, 88, 90 and 92 which provide a feedback signal to node 94 which is connected to the gates of transistors 64 and 76 and turns "off" compensation after transition at load 11 is complete as determined by transistor 14 thereby eliminating unnecessary power dissipation. The operation of gates of transistors 66 and 82 is for test purposes only to shut off DC current in transistors 68 and 70, and 78 and 80 respectively. The transistors 66 and 82 are not used during operation of the circuit. Transistors 20 and 22 are connected to enable signal shown schematically at 96 and transistors 30 and 36 are connected to the inverted or nonenable signal shown schematically at 98 which allows circuit 10 to be placed in the high impedance state as is well known in the art.

The purpose of the NAND and NOR gate configuration in conjunction with a pull-up and pull-down transistors 14 and 16 is to provide a tri-strate condition for the transistors 14 and 16 so that both of them can be completely shut off and that they are in neither a high nor a low condition which circuit is well-known in the art.

The increased sensitivity of transistors 62 and 64 as compared to transistors 18 and 20 and of transistors 74 and 76 as compared to transistors 30 and 32 can be explained as follows with respect to several different process parameters. For example, it is well-known that as the channel length decreases the speed of the transistor increases. Therefore if the channel lengths of the transistors 18, 20 and 14 are decreased because of process variations, this will tend to increase the speed at which the transistor 14 is turned "on" and speed with which transistor 14 drives load 11. However, these same process variations will decrease the channel lengths of the transistors 62 and 64. Thus, if the nominal channel lengths in the design of the circuit of the channels for the transistors 62 and 64 is designed to be less than the nominal channel lengths of the channels in transistors 18 and 20, any increase due to process variations in channel lengths of the transistors 18 and 20 will be percentage wise less then the corresponding increasing channel lengths in the transistors 62 and 64 and thus the absolute variations in the process variables will have a much larger effect on channels 62 and 64 thus making them more sensitive to process variations with respect to channel length than the transistors 18 and 20. It is this greater sensitivity coupled with the lesser strength of the transistors 62 and 64 which will overcome the sensitivity of transistors 18, 20 and 14 to channel length.

Other process parameters can be controlled in the same way. For example, to compensate for variations in supply voltage, transistors 62 and 64 can be designed to have a lower nominal gate to source voltage than the transistors 18 and 20 which again will cause the transistors 62 and 64 to have a greater percentage change in the characteristics with respect to the output characteristics transistors 18 and 20 to any variations in supply voltage. Similar nominal design criteria can be used with resepect to transistors 62 and 64 and transistors 18 and 20 which are affected by other process varibles including base mobility, channel width, threshold voltage, temperature, etc. all of which will be understood by a person skilled in the art and need not be described in detail.

Figure 2:
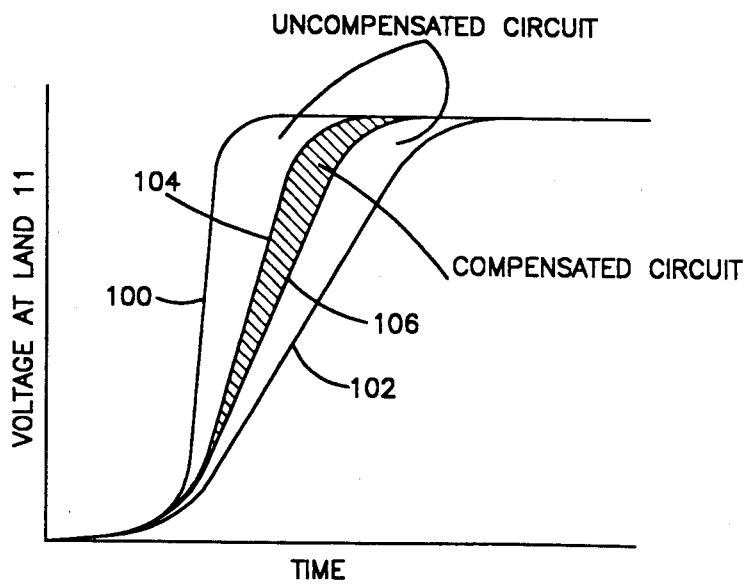
FIG. 2 is a graph showing the range of variations of operation between an uncompensated circuit and a circuit compensated according to this invention.

FIG. 2 is a graph plotting the voltage of load 11 against time for a typical uncompensated circuit as compared to a circuit according to this invention showing how the output characteristic of circuit 10 at load 11 varies with different changes in process, and how it is effected with transistors made according to the present invention. (For example, if all process parameters except channel length are held constant, and channel length is varied between the lower and upper limit of its process tolerance, the rise time of load 11 may vary by 35% in uncompensated circuit, whereas with the addition of compensation contained in this invention, the variation of rise time at load 11 is reduced to 5%. Each of the other variables will have the effects noted above.)

The graphs represent the response speed of the output of circuit 10 from a cumulative 3 sigma worst case variation of each process parameter to the cumulative 3 sigma statistical combination, the combined effect of process parameters on an uncompensated driver can be as high as ±60%, whereas, the compensation technique described in this invention will reduce the variations to ±20%. This is shown in FIG. 2 wherein the lines 100 and 102 represent the boundary condition of best case and worst case of a typical uncompensated circuit, and the lines 104 and 106 represent the boundary conditions of best case and worst case of a typical circuit compensated according to this invention, the area between the lines 104 and 106 being shaded. Thus with devices designed according to this invention, a designer can design much closer to nominal values and even in best case scenario the device will not operate too fast to provide interfering noise nor at worst case not operate at an extremely slow level from the nominal performance level.

Because of the difference in so many circuit parameters and process variables, it may be necessary to experiment slightly to find the exact amount of deviation or increased sensitivity which is necessary to design to transistors 62 and 64 and 74 and 76 as compared to transistors 18 and 20 and 30 and 32 and also to determine the exact value of how much less powerful these transistors 62 and 64 have to be with respect to transistors 18 and 20 and 74 and 76 with respect to transistors 30 and 32. Nevertheless with a minor amount of routine experimentation, this value can be very easily optimized.

While this invention has been described to some degree of particularity, numerous modifications and changes can be made without departing from the scope of the invention as defined in the appended claims.

What is claimed is:

1. An integrated circuit comprising at least a first FET device and a second FET device,
   and wherein a given performance characteristic of each of said first and second FET devices varies in the same manner with variation of at least one performance related variable condition,
   each of said FET devices have an output signal at least one characteristic of which is changed by a change in said performance related variable condition,
   the output signals of said first and second FET devices being merged, wherein said one output characteristic of said second FET device acts in opposition to said one output of said first FET device;
   said second FET device being constructed to be more responsive to said variations in said performance related variable condition than said first FET device and being constructed to have a weaker output signal than said first FET device whereby the merged output signal at said FET devices is maintained relatively constant irrespective of variations in the performance related variables condition.

2. The invention as defined in claim 1 wherein said circuit is a drive circuit and includes a third FET device the gate of which is connected to and operable by the merged output signal of said first and second FET devices.

3. The invention as defined in claim 2 wherein said circuit is formed on an integrated circuit chip, and the third FET device controls the operation of a capacitive load.

4. The invention as defined in claim 1 wherein said performance related process variable is channel length.

5. The invention as defined in claim 1 wherein said process related variable is channel width.

6. The invention as defined in claim 1 wherein said process related variable is threshold voltage.

7. The invention as defined in claim 1 wherein the process related variable is base mobility.

8. The invention as defined in claim 1 wherein the process variable compensates for power supply tolerance.

9. The invention as defined in claim 1 wherein the process variable compensates for device operating on temperatures.

10. A method of forming an integrated circuit having at least a first FET device and second FET device, and wherein a given performance characteristic of said first and second FET devices varies in the same manner with the variation of at least one performance related variable condition, and wherein each FET device has an output signal at least one characteristic of which is changed by a change in said performance related variable condition,
    the improvement which comprises, merging the output signals of said first and second FET devices wherein said one output characteristic of said second FET device acts in opposition to said one output characteristic of said first FET devices, constructing said second FET device to be more responsive to said variations in said performance related variable condition than said first FET device and to have a weaker output signal than said first FET device,
    whereby the merged output signal of said FET devices is maintained relatively constant irrespective of variations in the performance related variable conditions.

11. The invention as defined in claim 10 wherein a third FET device is provided, the gate of which is connected to and operable by the merged output signal of said first and second FET devices.

12. The invention as defined in claim 11 wherein said circuit is formed on a interated circuit chip, and the third FET device controls the operation of a capacitive load.

13. The invention as defined in claim 10 wherein said performance related process variable is channel length.

14. The invention as defined in claim 10 wherein said process related variable is channel width.

15. The invention as defined in claim 10 wherein said process related variable is threshold voltage.

16. The invention as defined in claim 10 where the process related variable is base mobility.

17. The invention as defined in claim 10 wherein the process variable compensates for power supply tolerance.

18. The invention as defined in claim 10 wherein the process variable compensates for device operating temperature.

* * * * *